(12) United States Patent
Kim et al.

(10) Patent No.: US 9,417,516 B2
(45) Date of Patent: Aug. 16, 2016

(54) PHASE SHIFT MASK AND METHOD OF MANUFACTURING DISPLAY APPARATUS USING THE SAME

(71) Applicant: SAMSUNG DISPLAY CO., LTD., Yongin, Gyeonggi-Do (KR)

(72) Inventors: Bongyeon Kim, Yongin (KR); Min Kang, Yongin (KR); Yong Son, Yongin (KR); Hyunjoo Lee, Yongin (KR); Myounggeun Cha, Yongin (KR); Jinho Ju, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/794,079

(22) Filed: Jul. 8, 2015

(65) Prior Publication Data

US 2016/0097972 A1 Apr. 7, 2016

(30) Foreign Application Priority Data

Oct. 6, 2014 (KR) .................. 10-2014-0134486

(51) Int. Cl.
*H01L 21/00* (2006.01)
*G03F 1/26* (2012.01)
*G03F 7/20* (2006.01)
*H01L 21/02* (2006.01)

(52) U.S. Cl.
CPC .. *G03F 1/26* (2013.01); *G03F 7/20* (2013.01); *H01L 21/0268* (2013.01); *H01L 21/02678* (2013.01)

(58) Field of Classification Search
CPC .............. H01L 21/02678; H01L 21/0268; G03F 1/26

USPC ............... 430/5, 319, 321; 438/487
See application file for complete search history.

(56) References Cited

U.S. PATENT DOCUMENTS

| 6,316,338 | B1 | 11/2001 | Jung |
| 7,018,750 | B2 | 3/2006 | Hwang |
| 2001/0001745 | A1 | 5/2001 | Im et al. |
| 2001/0007731 | A1 | 7/2001 | Inazuki et al. |
| 2004/0076894 | A1 | 4/2004 | Hwang |
| 2004/0126674 | A1* | 7/2004 | Taniguchi ......... H01L 21/02532 430/5 |

(Continued)

FOREIGN PATENT DOCUMENTS

| KR | 10-2001-0004129 A | 1/2001 |
| KR | 10-2001-0088312 A | 9/2001 |

(Continued)

OTHER PUBLICATIONS

Nakata, et al., "Single-crystalline Silicon TFTs Fabricated with Comb-shaped Beam in ZMR-ELA," IDW/AD 2005, pp. 959-960.

*Primary Examiner* — John A McPherson
(74) *Attorney, Agent, or Firm* — Lee & Morse, P.C.

(57) ABSTRACT

Provided is a method of manufacturing a display apparatus, the method including forming an amorphous silicon layer on a substrate; changing amorphous silicon in the amorphous silicon layer into crystalline silicon by irradiating the amorphous silicon with a laser beam emitted through a phase shift mask; and forming a display device, the phase shift mask including a base substrate; a barrier layer on the base substrate and including a plurality of transmissive portions which are spaced apart from each other in a first direction; and phase shift portions which alternately fill the plurality of transmissive portions in the first direction.

10 Claims, 4 Drawing Sheets

(56) References Cited

U.S. PATENT DOCUMENTS

| | | |
|---|---|---|
| 2004/0232432 A1 | 11/2004 | Sato et al. |
| 2006/0276013 A1 | 12/2006 | Chao |
| 2007/0048978 A1 | 3/2007 | Sun |
| 2007/0148924 A1 | 6/2007 | Park |
| 2008/0045042 A1 | 2/2008 | Chu et al. |
| 2008/0123200 A1 | 5/2008 | Chu et al. |
| 2009/0098471 A1 | 4/2009 | Chu et al. |
| 2010/0103401 A1 | 4/2010 | Chu et al. |
| 2011/0117731 A1 | 5/2011 | Park et al. |
| 2011/0220904 A1 | 9/2011 | Lee et al. |

FOREIGN PATENT DOCUMENTS

| | | |
|---|---|---|
| KR | 10-2004-0031315 A | 4/2004 |
| KR | 10-2004-0100860 A | 12/2004 |
| KR | 10-2006-0133332 A | 12/2006 |
| WO | WO 97/45827 A1 | 12/1997 |

* cited by examiner

PHASE SHIFT MASK AND METHOD OF MANUFACTURING DISPLAY APPARATUS USING THE SAME

CROSS-REFERENCE TO RELATED APPLICATION

Korean Patent Application No. 10-2014-0134486, filed on Oct. 6, 2014, in the Korean Intellectual Property Office, and entitled: "Phase Shift Mask and Method of Manufacturing Display Apparatus by using the Same," is incorporated by reference herein in its entirety.

BACKGROUND

1. Field

One or more exemplary embodiments relate to a phase shift mask and a method of manufacturing a display apparatus using the same, for example, to a phase shift mask, which may be used to effectively crystallize an amorphous silicon layer so as to form a crystalline silicon layer, and a method of manufacturing a display apparatus using the same

2. Description of the Related Art

An organic light-emitting display apparatus or a liquid crystal display apparatus, for example, may control the amount of light emitted from each pixel or the angle in which light is emitted from each pixel using a thin film transistor (TFT).

SUMMARY

Embodiments may be realized by providing a method of manufacturing a display apparatus, the method including forming an amorphous silicon layer on a substrate; changing amorphous silicon in the amorphous silicon layer into crystalline silicon by irradiating the amorphous silicon with a laser beam emitted through a phase shift mask; and forming a display device, the phase shift mask including a base substrate; a barrier layer on the base substrate and including a plurality of transmissive portions which are spaced apart from each other in a first direction; and phase shift portions which alternately fill the plurality of transmissive portions in the first direction.

Each of the plurality of transmissive portions may extend in a second direction perpendicular to the first direction.

The barrier layer may cover an edge of the base substrate.

The phase shift portions may include a material having a phase-inversion property.

The barrier layer on the base substrate may further include an additional transmissive portion which is connected to the plurality of transmissive portions, and the plurality of transmissive portions may be arranged along one side of the additional transmissive portion.

The phase shift mask may further include an additional phase shift portion which fills the additional transmissive portion.

The phase shift portions may include a material having a phase-inversion property, and the additional phase shift portion may include a material which shifts a phase of the laser beam by about λ/4 when a wavelength of the laser beam is λ.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
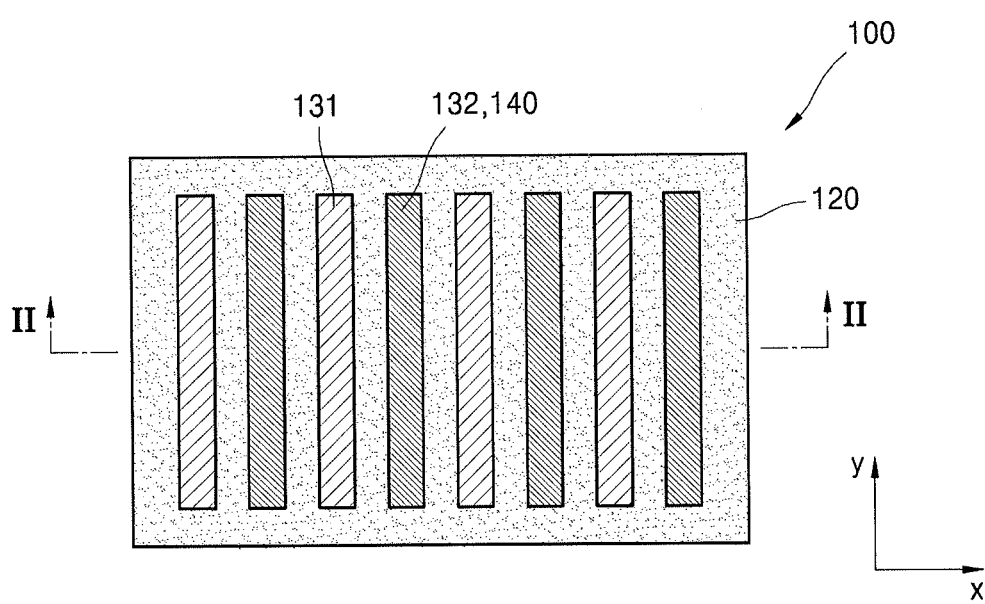
FIG. 1 illustrates a schematic plan view of a phase shift mask according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Like reference numerals in the drawings denote like elements, and repeated descriptions thereof will be omitted.

It will be understood that when a component, such as a layer, a film, a region, or a plate, is referred to as being "on" another component, the component can be directly on the other component or intervening components may be present thereon. Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
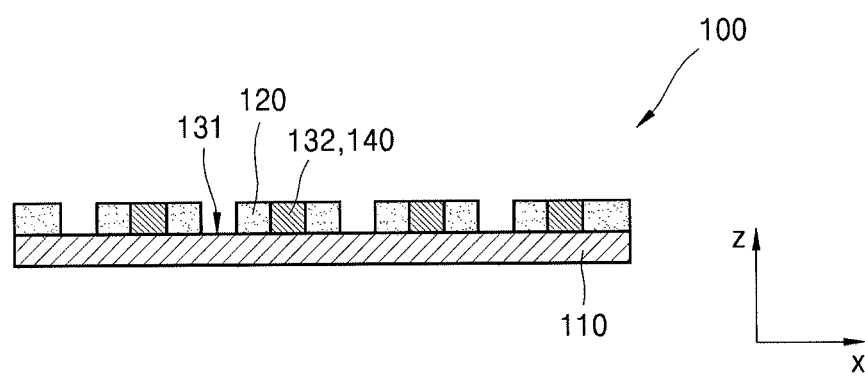
FIG. 2 illustrates a schematic cross-sectional view taken long a line II-II of FIG. 1.

FIG. 1 illustrates a schematic plan view of a phase shift mask 100, and FIG. 2 illustrates a schematic cross-sectional view taken long a line II-II of FIG. 1. The phase shift mask 100 may include a base substrate 110, a barrier layer 120, and phase shift portions 140.

The base substrate 110 may form an overall exterior of the phase shift mask 100 and may include light-transmissive materials. For example, the base substrate 110 may be formed of light-transmissive plastics such as a glass material or polyimide.

The barrier layer 120 may be formed on the base substrate 110 and may have transmissive portions 131 and 132 which may be separate from each other on the barrier layer 120 in a first direction (e.g., +x direction). A laser beam may be emitted, for example, downward (e.g., in −z direction), toward the barrier layer 120. Portions of the laser beam which are incident on the transmissive portions 131 and 132 of the barrier layer 120 may pass therethrough, while portions of the laser beam which are incident on locations other than the transmissive portions 131 and 132 of the barrier layer 120 may not pass through the same. The barrier layer 120 may include materials which may absorb or reflect the laser beam, for example, chromium (Cr). As shown in FIG. 1, the transmissive portions 131 and 132 formed by the barrier layer 120 may extend in a second direction (+y direction) perpendicular to the first direction (+x direction).

The phase shift portions 140 may be arranged to alternately fill the transmissive portions 131 and 132 in the first direction (+x direction). FIGS. 1 and 2 illustrate that the transmissive portions 132, and not the transmissive portions 131, may be filled with the phase shift portions 140. The phase shift portions 140 may change a phase of the laser beam which penetrates phase shift portions 140, for example, the phase shift portions 140 may include a material having a phase-inversion property. The material having a phase-inversion property may be Molybdenum Silicide ($MoSi_x$). Having a phase-inversion property may mean that, when a wavelength of the laser beam penetrating phase shift portions 140 is $\lambda$, the phase of the laser beam which penetrates the phase shift portions 140 is shifted by about $\lambda/2$. Accordingly, a phase of the laser beam which penetrates the phase shift portions 140 may be opposite to a phase of the laser beam which does not penetrate the same.

Figure 3:
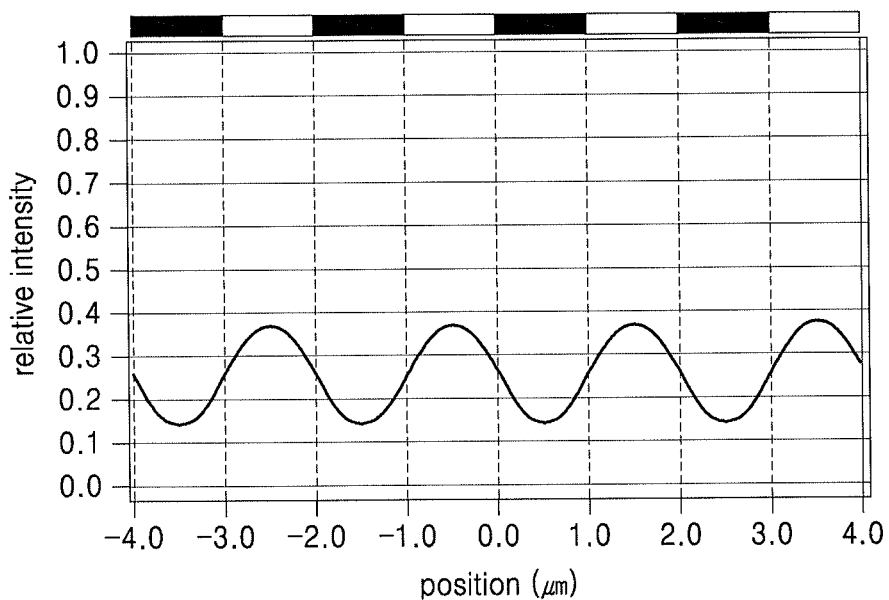
FIG. 3 illustrates a schematic graph of intensities of laser beams emitted toward a crystallization mask and incident on locations of the crystallization mask, according to a comparative example.

FIG. 3 illustrates a schematic graph of intensities of laser beams emitted toward a crystallization mask and incident on locations of the crystallization mask, according to a comparative example. The crystallization mask according to the comparative example may not include the phase shift portions 140 which are included in the phase shift mask 100 of FIGS. 1 and 2. In an upper part of FIG. 3, portions where the laser beams are blocked due to a barrier layer are colored black, and portions where the laser beams penetrate through the transmissive portions are colored white. In FIG. 3, a horizontal axis indicates, for example, positions in the x-axis direction of FIGS. 1 and 2, and a vertical axis indicates a relative intensity, that is, a normalized intensity of a laser beam which penetrates the crystallization mask.

As shown in FIG. 3, in the case of the crystallization mask according to the comparative example, the portions where the laser beams are blocked due to the barrier layer have lower intensities than the portions where the laser beams penetrate the transmissive portions. However, some of the laser beams which penetrate the transmissive portions may propagate toward under, e.g., through, the barrier layer due to various optical phenomena, and the intensities of the laser beams are not equal to 0 in the portions where the laser beams are blocked due to the barrier layer, as shown in FIG. 3. Accordingly, the intensities of the laser beams which may be emitted to crystallize an amorphous silicon layer may not be sufficiently increased because the intensity of the laser beams in the portions where the laser beams are blocked due to the barrier layer may increase as the intensity of the laser beams which may be emitted to crystallize the amorphous silicon layer increases.

Figure 4:
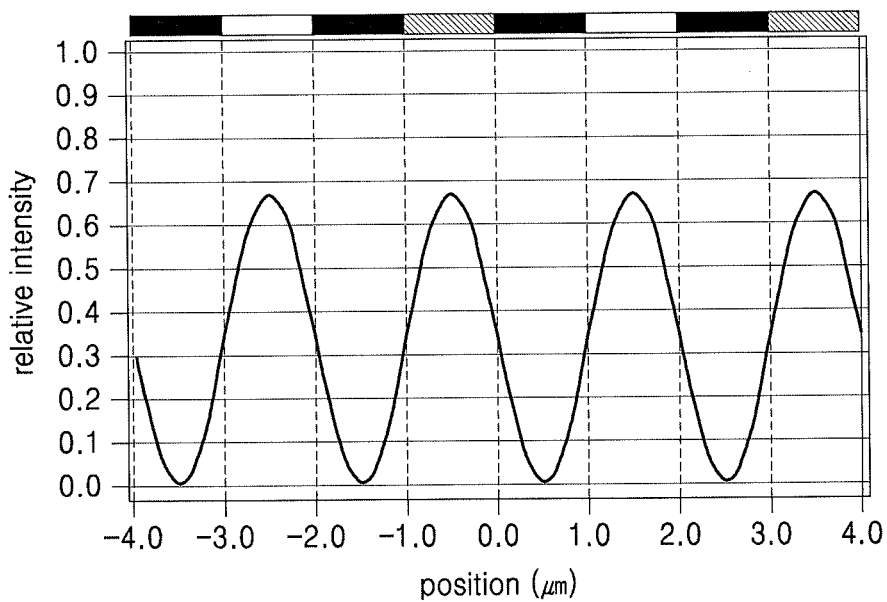
FIG. 4 illustrates a schematic graph of intensities of laser beams emitted toward the phase shift mask and incident on locations of the phase shift mask of FIG. 1.

FIG. 4 illustrates a schematic graph of intensities of laser beams emitted toward the phase shift mask and incident on locations of the phase shift mask 100 of FIG. 1. In an upper part of FIG. 4, portions where the laser beams are blocked due to the barrier layer 120 are colored black, portions where the laser beams penetrate the transmissive portions 131 without a phase shift are colored white, and portions where the laser beams penetrate the transmissive portions 132 filled with the phase shift portions 140 are hatched. In FIG. 4, a horizontal axis indicates positions in the x-axis direction of FIGS. 1 and 2, and a vertical axis indicates a relative intensity which is a normalized intensity of laser beam which penetrates the crystallization mask.

When FIGS. 3 and 4 are compared, in the case of the phase shift mask 100 according to the present embodiment, intensities of the laser beams in portions which correspond to the barrier layer 120 are almost equal to 0, and relative intensities of the laser beams in portions which correspond to the transmissive portions 131 and 132 are increased. When crystallizing an amorphous silicon layer through a sequential lateral solidification (SLS) method, laser beams having a sufficient intensity for crystallizing the amorphous silicon layer may be emitted toward the amorphous silicon layer, and a time required to crystallize the amorphous silicon layer by emitting the laser beams may be dramatically decreased.

In the phase shift mask 100, some laser beams which penetrate the transmissive portions 131 and 132 may propagate toward under, e.g., through, the barrier layer 120 due to various optical phenomena. The laser beams which penetrate the transmissive portions 131 may be opposite in phase to the laser beams which penetrate the transmissive portions 132, and destructive interference may occur. Accordingly, resulting intensities of the laser beams that may propagate under the barrier layer 120 may be dramatically decreased. As a result, the relative intensities of FIG. 4 may be generated. When the amorphous silicon layer is crystallized using the phase shift mask 100 through the SLS method, a high quality crystalline silicon layer may be acquired in a short time.

Figure 5:
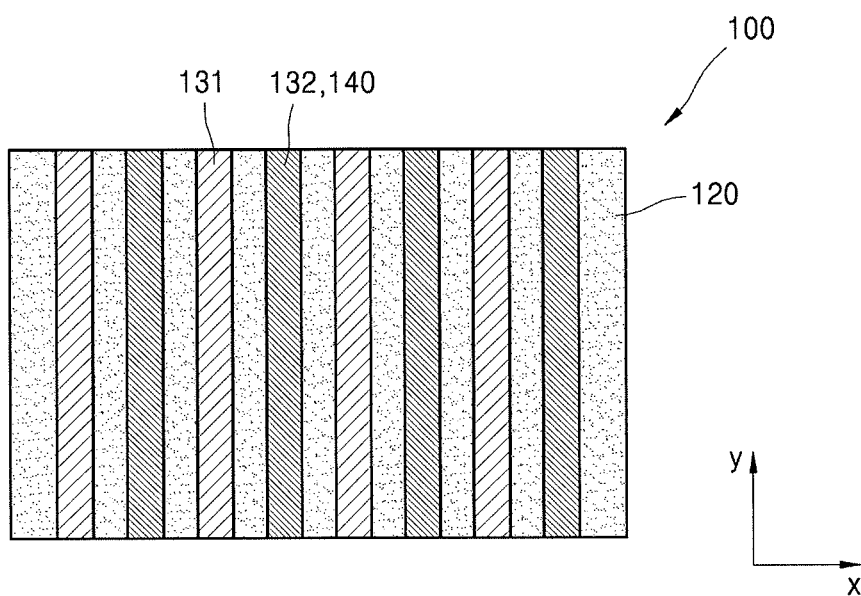
FIG. 5 illustrates a schematic plan view of a phase shift mask according to another exemplary embodiment.

As shown in FIG. 1, the barrier layer 120 of the phase shift mask 100 may cover an edge of the base substrate. As shown in FIG. 5, the transmissive portions 131 and 132 may extend to an end portion of the base substrate in the second direction (+y direction).

Figure 6:
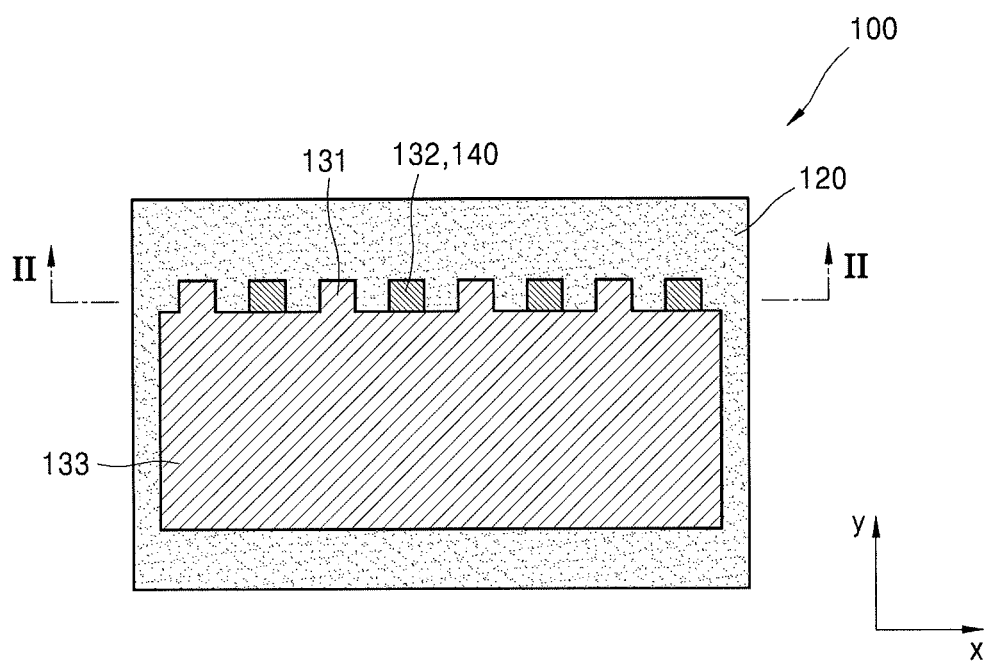
FIG. 6 illustrates a schematic plan view of a phase shift mask according to another exemplary embodiment.

FIG. 6 illustrates a schematic plan view of a phase shift mask 100 according to another exemplary embodiment. The phase shift mask 100 may include a base substrate (as shown in FIG. 2) and a barrier layer 120 disposed on the base substrate. As described above, the barrier layer 120 may have transmissive portions 131 and 132 which may be separate from each other in the first direction (+x direction). Phase shift portions 140 may alternately fill the transmissive portions 131 and 132, and the transmissive portions 132, other than the transmissive portions 131, may be filled with the phase shift portions 140. The barrier layer 120 may further include an additional transmissive portion 133 which may be connected to the transmissive portions 131 and 132, and the transmissive portions 131 and 132 may be disposed along one side of the additional transmissive portion 133.

In the phase shift mask 100, it may be understood that a cross-section taken along a line II-II of FIG. 6 is similar to a cross-section of FIG. 2. Some of the laser beams which penetrate the transmissive portions 131 and 132 may propagate toward under, e.g., through, the barrier layer 120 due to various optical phenomena. The laser beams which penetrate the transmissive portions 131 may have an opposite phase to the laser beams which penetrate the transmissive portions 132, and destructive interference may occur. Accordingly, resulting intensities of the laser beams that may propagate under the barrier layer 120 may be dramatically decreased. As a result, relative intensities which is the same or similar to the relative intensities of FIG. 4 may be generated. When an amorphous silicon layer is crystallized using the phase shift mask 100 according to the present embodiment through the SLS method, seeds may be rapidly formed in portions of the amorphous silicon layer which correspond to the transmissive portions 131 and 132 or the barrier layer 120, crystallization from the seeds to portions of the amorphous silicon layer which correspond to the additional transmissive portion 133 may be rapidly performed, and a high-quality crystalline silicon layer may be acquired in a short time.

Figure 7:
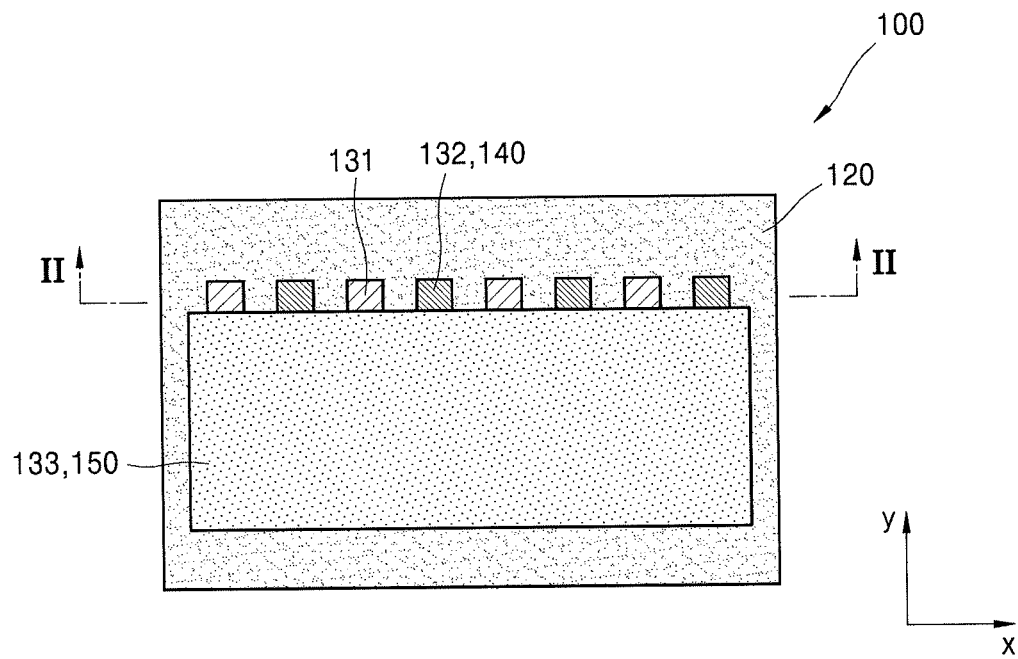
FIG. 7 illustrates a schematic plan view of a phase shift mask according to another exemplary embodiment.

FIG. 7 illustrates a schematic plan view of a phase shift mask 100 according to another exemplary embodiment. A difference between the phase shift mask 100 of the present embodiment and that of FIG. 6 is that the phase shift mask 100 of the present embodiment may further include an additional phase shift portion 150 which may fill the additional transmissive portion 133. When a wavelength of laser beams which penetrate the additional phase shift portion 150 is λ, the additional phase shift portion 150 may include a material shifting a phase of the laser beams to about λ/4.

In the phase shift mask 100 of FIG. 6, some of the laser beams which penetrate the transmissive portions 132 may propagate toward an area of the amorphous silicon layer corresponding to the additional transmissive portion 133 due to various optical phenomena. Some of the laser beams which penetrate the additional transmissive portion 133 may propagate toward areas of the amorphous silicon layer corresponding to the transmissive portions 132 due to various optical phenomena. Destructive interference of the laser beams in the area corresponding to the additional transmissive portion 133 or the areas corresponding to the transmissive portions 132 of the amorphous silicon layer may occur, and destructive interference may result in a decrease of the intensities of the laser beams emitted toward the area corresponding to the additional transmissive portion 133 or the areas corresponding to the transmissive portions 132 of the amorphous silicon layer.

In the phase shift mask 100 of FIG. 7, the additional phase shift portion 150 may fill the additional transmissive portion 133, and a phase of the laser beams which penetrate the transmissive portions 132 may not be opposite to a phase of the laser beams which penetrate the additional transmissive portion 133. For example, when the phase of the laser beams which penetrate the transmissive portions 132 is shifted by about λ/2, and when a phase of laser beams which penetrate additional transmissive portion 133 is shifted by about λ/4, the phase of the laser beams which penetrate the transmissive portions 132 may not be opposite to the phase of laser beams which penetrate additional transmissive portion 133. Occurrence of destructive interference in the area corresponding to the additional transmissive portion 133 and/or the areas corresponding to the transmissive portions 132 of the amorphous silicon layer may be prevented or minimized. Since the phase of the laser beams which penetrate the transmissive portions 131 may not be opposite to the phase of laser beams which penetrate the additional transmissive portion 133 either, occurrence of destructive interference in the area corresponding to the additional transmissive portion 133 and/or the areas corresponding to the transmissive portions 131 may be prevented or minimized.

The phase shift mask 100 which may be used to crystallize an amorphous silicon layer through the SLS method has been described. Further provided is a method of manufacturing a display apparatus using the phase shift mask 100.

Figure 8:
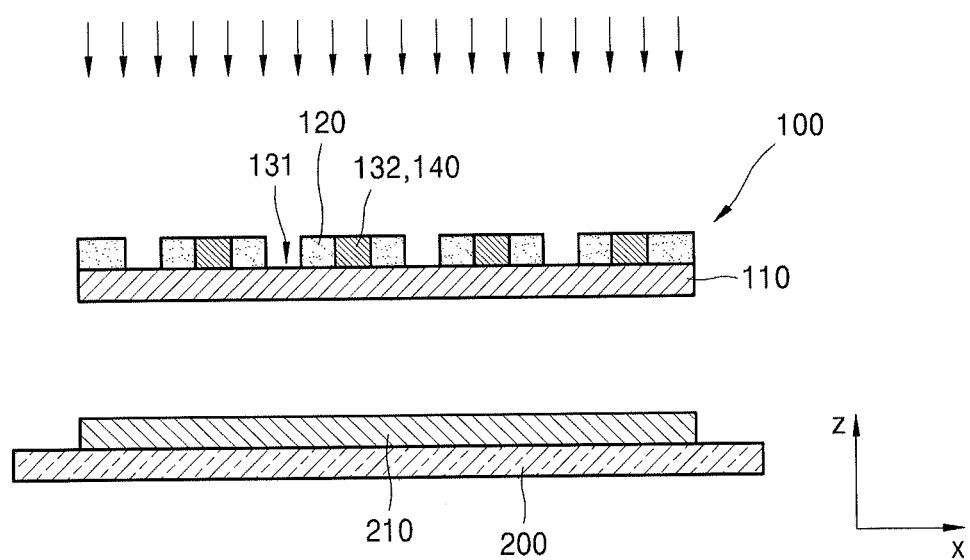
FIG. 8 illustrates a schematic cross-sectional view of a stage of a method of manufacturing a display apparatus, according to an exemplary embodiment.

FIG. 8 illustrates a schematic cross-sectional view of a stage of a method of manufacturing a display apparatus, according to an exemplary embodiment. As shown in FIG. 8, an amorphous silicon layer 210 may be formed on a substrate 200, and then a phase shift mask 100 which is similar to the phase shift mask 100 of FIGS. 1 and 2 may be arranged on an upper surface of the amorphous silicon layer 210. Laser beams may be emitted toward the amorphous silicon layer 210 through the phase shift mask 100, and amorphous silicon in the amorphous silicon layer 210 may be changed to crystalline silicon. Then, a thin film transistor (TFT), for example, may be formed using the crystalline silicon layer and a display device such as an organic light-emitting device which may be electrically connected to the TFT may be formed, and a display apparatus may be manufactured.

If the phase shift mask 100 described with reference to FIGS. 1 and 2 is used, intensities of laser beams in portions which correspond to the barrier layer 120 may be almost equal to 0, as shown in FIG. 4, and relative intensities of the laser beams in portions which correspond to the transmissive portions 131 and 132 may be large. Accordingly, laser beams having sufficient intensities may be emitted toward the amorphous silicon layer 210 when the amorphous silicon layer 210 is crystallized through the SLS method during a manufacture of the display apparatus, and a time required to crystallize the amorphous silicon layer 210 by emitting the laser beams may be dramatically decreased.

The phase shift mask 100 which may be used for a method of manufacturing another display apparatus may not be limited to the phase shift mask 100 described with reference to FIGS. 1 and 2. For example, the phase shift mask 100 of FIG. 5 in which the transmissive portions 131 and 132 may extend to an end portion of the base substrate in the second direction (+y direction) may be used, the phase shift mask 100 of FIG. 6 in which the barrier layer 120 may further include the additional transmissive portion 133 connected to the transmissive portions 131 and 132, and the transmissive portions 131 and 132 may be disposed along one side of the additional transmissive portion 133, may be used. Furthermore, the phase shift mask 100 further including the additional phase shift portion 150 which may fill the additional transmissive portion 133 may be used.

By way of summation and review, a TFT may include, for example, a semiconductor layer, a gate electrode, or a source/drain electrode, and the semiconductor layer may be a crystalline silicon layer which may be formed by crystallizing an amorphous silicon layer.

In a TFT substrate including the TFT or a method of manufacturing a display apparatus using the TFT substrate, an amorphous silicon layer may be formed on a substrate and then may be crystallized to form a crystalline silicon layer, and a TFT substrate or a display apparatus including the same may be manufactured.

Since an amorphous silicon layer may need to be crystallized to form a crystalline silicon layer on various locations of a substrate when a display apparatus is manufactured, a laser beam may need to be emitted toward the amorphous silicon layer. When an amorphous silicon layer is crystallized to form a crystalline silicon layer according to a comparative manufacturing method, it may be difficult to emit a laser beam having a sufficient intensity level, and it may take a long time to crystallize the amorphous silicon layer by emitting the laser beam.

One or more exemplary embodiments include a phase shift mask which may be used to effectively crystallize an amorphous silicon layer to form a crystalline silicon layer and a method of manufacturing a display apparatus using the phase shift mask.

The above-described method of manufacturing a display apparatus may include, for example, a method of manufacturing an organic light-emitting display apparatus which uses an emission device as a display device, or a method of manufacturing a liquid crystal display apparatus using a liquid crystal display as a display apparatus. Further provided is a method of manufacturing a display apparatus having a TFT which may include an active layer formed of crystalline silicon.

As described above, according to the one or more of the above exemplary embodiments, provided are a phase shift mask which may be used to effectively crystallize an amorphous silicon layer to from a crystalline silicon layer, and a method of manufacturing a display apparatus using the phase shift mask.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display apparatus, the method comprising:
    forming an amorphous silicon layer on a substrate;
    changing amorphous silicon in the amorphous silicon layer into crystalline silicon by irradiating the amorphous silicon with a laser beam emitted through a phase shift mask; and
    forming a display device,
    the phase shift mask including:
    a base substrate;
    a barrier layer on the base substrate and including a plurality of transmissive portions which are spaced apart from each other in a first direction; and
    phase shift portions which alternately fill the plurality of transmissive portions in the first direction, the phase shift portions including a material different from the base substrate.

2. The method as claimed in claim 1, wherein each of the plurality of transmissive portions extends in a second direction perpendicular to the first direction.

3. The method as claimed in claim 1, wherein the barrier layer covers an edge of the base substrate.

4. The method as claimed in claim 1, wherein the phase shift portions include a material having a phase-inversion property.

5. A method of manufacturing a display apparatus, the method comprising:
    forming an amorphous silicon layer on a substrate;
    changing amorphous silicon in the amorphous silicon layer into crystalline silicon by irradiating the amorphous silicon with a laser beam emitted through a phase shift mask; and
    forming a display device,
    the phase shift mask including:
    a base substrate;
    a barrier layer on the base substrate and including a plurality of transmissive portions which are spaced apart from each other in a first direction; and
    phase shift portions which alternately fill the plurality of transmissive portions in the first direction,
    wherein:
    the barrier layer on the base substrate further includes an additional transmissive portion which is connected to the plurality of transmissive portions, and
    the plurality of transmissive portions are arranged along one side of the additional transmissive portion.

6. The method as claimed in claim 5, wherein the phase shift mask further includes an additional phase shift portion which fills the additional transmissive portion.

7. The method as claimed in claim 6, wherein:
    the phase shift portions include a material having a phase-inversion property, and
    the additional phase shift portion includes a material which shifts a phase of the laser beam by about $\lambda/4$ when a wavelength of the laser beam is $\lambda$.

8. The method as claimed in claim 4, wherein the material having a phase-inversion property is molybdenum silicide.

9. A method of manufacturing a display apparatus, the method comprising:
    forming an amorphous silicon layer on a substrate;
    changing amorphous silicon in the amorphous silicon layer into crystalline silicon by irradiating the amorphous silicon with a laser beam emitted through a phase shift mask; and
    forming a display device,
    the phase shift mask including:
    a base substrate;
    a barrier layer on the base substrate and including a plurality of transmissive portions which are spaced apart from each other in a first direction; and
    phase shift portions which alternately fill the plurality of transmissive portions in the first direction, the phase shift portions having an upper surface at a same distance from the base substrate as an upper surface of the barrier layer.

10. The method as claimed in claim 9, wherein the phase shift portions include molybdenum silicide.

* * * * *